INVENTOR.
Raymond M. Warner Jr.

BY
Mueller & Aichele
ATT'YS.

INVENTOR.
Raymond M. Warner Jr.
BY Mueller & Aichele
ATTYS.

INVENTOR.
Raymond M. Warner Jr.

BY Mueller & Aichele

ATT'YS.

United States Patent Office 3,404,295
Patented Oct. 1, 1968

3,404,295

HIGH FREQUENCY AND VOLTAGE TRANSISTOR WITH ADDED REGION FOR PUNCH-THROUGH PROTECTION

Raymond M. Warner, Jr., Scottsdale, Ariz., assignor to Motorola, Inc., Franklin Park, Ill., a corporation of Illinois Filed Nov. 30, 1964, Ser. No. 414,525
15 Claims. (Cl. 307—302)

ABSTRACT OF THE DISCLOSURE

A semiconductor structure having a pair of rectifying junctions respectively separating regions of opposite conductivity type materials, with one junction being of greater extent than the other. A lock region having a conductivity type of the intermediate region is embedded in the region adjacent the longer junction and extends in spaced parallel relationship to that junction for limiting the penetration of any depletion layer toward said second junction thereby preventing voltage punch-through of the intermediate region. The lock region extends only partially across the semiconductor structure.

This invention relates generally to transistors, and more particularly to a transistor which provides improved high power, high frequency operation.

High power transistors which have been provided in the past have not been suitable for high frequency operation. Further, such high power transistors have not had constant gain over a large voltage range, and have provided low gain at low voltages and higher gain at higher voltages. This is because in order to withstand high voltages, it is necessary that the base region of the transistor be relatively thick. However, when high voltage is applied to the collector region of the transistor, the collector depletion layer extends into the base region to effectively reduce the base thickness. When the operating voltage is increased so that the collector depletion layer reaches the emitter electrode, objectionable punch-through takes place. Because of the requirement of a relatively thick base region to prevent punch-through at high voltage operation, the carriers therein have a longer distance to travel and at low voltage a large number of the carriers are dissipated to reduce the gain. When higher voltage is applied, the collector depletion area extends into the base region so that the distance of carrier travel is shorter and fewer carriers are lost, so that the gain increases.

Another problem with high power transistors is that known structures are not suitable for high frequency operation. This is because the collector-base capacitance is relatively high. Also, the thick base requires long transit time for the carriers, which limits the high frequency response.

It is therefore an object of the present invention to provide an improved high power, high frequency transistor.

Another object of the invention is to provide a high voltage, high gain transistor, wherein the gain remains substantially constant over a wide range of operating voltages.

A further object is to provide a transistor which can be operated over a wide range of voltages without causing punch-through between the collector depletion layer and the emitter region.

A still further object of this invention is to provide a transistor which operates in a manner analogous to the operation of a vacuum tube.

A more specific object of the invention is to provide a transistor in which the extent of the collector depletion layer into the base region is controlled.

A feature of the invention is the provision of a transistor having emitter and collector regions separated by a base region, wherein the collector region includes a lock layer for controlling the shape of the collector depletion layer which extends into the base region toward the emitter region.

Another feature of the invention is the provision of a transistor having a collector electrode separated from the emitter electrode by a base region of opposite conductivity type to the collector and emitter regions, with a layer embedded in the collector region having the same conductivity type as the base region which acts to shape the collector depletion layer so that it does not extend into the base region to engage the emitter with incrasing collector voltage.

A further feature of the invention is the provision of a transistor having a base region with an emitter region formed therein, and a collector region having a junction with the base region, wherein a lock layer is provided in the collector region for controlling the shape of the depletion layer formed in the base region, which has a portion extending to an external surface of the collector region for application of a control voltage thereto. By application of a control voltage to the lock layer, analog operation can be provided.

A still further feature of the invention is the provision of a transistor having a collector with a lock layer to control the shape of the collector depletion layer in the base region, so that the base region can be thinner, and which divides the capacity of the depletion layer so that the overall capacity is less, to thereby provide better high frequency operation.

The invention is illustrated in the drawing wherein.

In practicing the invention there is provided a transistor having base, emitter and collector regions, with the base region being of one conductivity type and the emitter and collector regions being of the opposite conductivity type. The transistor can be of either the NPN or the PNP type. The transistor includes a lock layer in the collector region which is spaced from the junction between the base and collector regions. The layer is of the same conductivity type as the base region, and acts to lock the position of the collector depletion layer formed when voltage is applied to the collector electrode with respect to the base electrode. When an increasing voltage is applied to the collector region, the collector depletion layer extends into the collector and base regions, until the depletion layer engages the lock layer. As the voltage is further increased, the depletion layer is shaped by the lock layer so that it does not extend farther into the base region, thus not engaging the emitter region to produce punch-through. The lock layer should be positioned with respect to the junction between the collector and base regions so that the depletion layer reaches the lock layer before it reaches the emitter region.

The lock layer in the collector electrode may be embedded within the electrode and have no external connection thereto. In an alternate construction, the lock layer may have a portion extending to an external surface of the collector electrode, so that a bias potential can be applied between the lock layer and the base region to control the shape of the collector depletion layer between the base and the lock layer. In another embodiment of the invention, the emitter is biased with respect to the base, and a control voltage is applied to the lock layer to thereby control the collector current.

Figure 1:
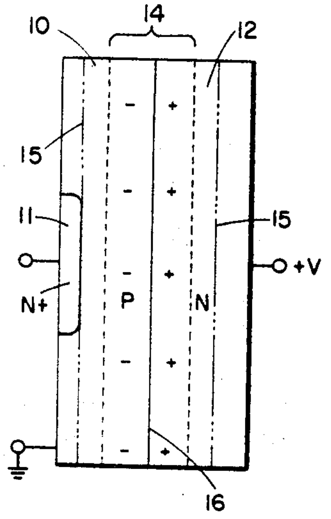
FIG. 1 shows a transistor of usual construction and the collector depletion layer formed therein.

Referring now to the drawings, in FIG. 1 there is shown a transistor of usual construction having a base region 10, an emitter region 11 and a collector region 12. The base region may be of P conductivity type material as shown, with the emitter and collector regions being of N type conductivity material, to form an NPN transistor. It is to be pointed out, however, that the invention is also applicable to a PNP type transistor wherein the conductivity of the regions is reversed with respect to that shown in FIG. 1.

As is well-known, when a positive voltage is applied to the collector region 12 with respect to the base region 10, a depletion region or layer forms at the junction between the collector and base regions, and extends on either side into both regions. This layer is shown by the dotted lines, being marked by a bracket and identified by numeral 14. As the positive voltage applied to the collector region increases, the depletion layer increases in thickness. The effective thickness of the base region decreases as the depletion layer extends. When sufficient voltage is applied, the depletion layer will extend into the base region to the junction between the emitter and base regions, as shown by he dot-dash lines 15. This will cause what is commonly known as "punch-through," which is effectively an interconnection of the collector region with the emitter region.

The variation in thickness of the depletion layer and the effective change in the base thickness is highly objectionable. First, the gain of the transistor varies inversely with the thickness of the base region, because a thicker base region results in greater loss of carriers in transit as compared to a thinner base region. As the voltage applied to the collector region is increased, the thickness of the depletion layer increases and the effective base thickness is reduced to thereby increase the gain. Further, the voltage which may be applied to the transistor is limited to a value below that causing the depletion layer to reach the emitter region to provide punch-through. The requirement of a relatively thick base region to prevent punch-through at voltages to be used is also objectionable for high frequency operation, as the transit time required for carriers to move between the emitter and collector regions is made objectionably long.

In accordance with this invention the shape of the collector depletion layer with respect to the emitter region is controlled by the use of a lock layer in the collector electrode which is of the same conductivity type as the base region. This is illustrated by the transistor structure of FIG. 2. The base, emitter and collector regions of the transistor are numbered 10, 11 and 12 as in FIG. 1. The lock layer 20 embedded in the collector region 12 is indicated to be of P type material, as is the base region 10. The collector depletion layer 14 shown by dotted lines extends on either side of the base-collector junction 16 as in FIG. 1. The layer 14 is that resulting from the critical voltage ($V_{crit}$) at which the depletion layer extends to the embedded layer 20 and punches through to the surface 20*a* of this layer. For voltages applied to the collector electrode 12 up to this critical value, the action is exactly the same as in the structure of FIG. 1.

When the voltage applied to the collector region 12 exceeds the critical value, the embedded layer 20 will lock the depletion layer 14 so that it will not move into the base region beyond the position reached at the critical voltage. The dot-dash lines 21 indicate the position of the depletion layer when a voltage ($V_{crit}+\Delta V$) greater than the critical voltage is applied to the collector electrode 12. It will be noted that adjacent the emitter electrode, the depletion layer stays at the same position as for the critical voltage. In the regions laterally removed from the emitter layer, the depletion layer 21 moves farther into the base electrode region, in the manner shown in FIG. 1. The depletion layer also extends around the embedded layer 20 and extends into the embedded layer from the boundary 20*b* thereof remote from the collector-base junction 16. The depletion layer is therefore divided with a first portion 21*a* extending on both side of the collector-base junction into the base region and into the collector region to the embedded layer 20, and a second portion 21*b* extending on both sides of the boundary 20*b* of the embedded layer 20 into the layer 20 and into the collector region 12 back of this layer.

Figure 2:
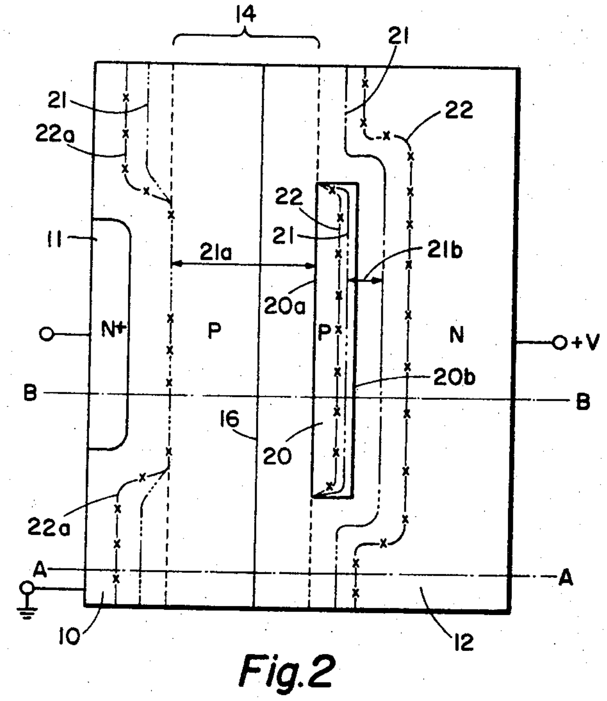
FIG. 2 illustrates a transistor in accordance with the invention having a lock layer in the collector region.

In FIG. 2 there is also shown the depletion layer when a still greater voltage ($V_{crit}+2\Delta V$) is applied to the collector electrode. This is represented by the dash-*x* lines 22. Although the depletion layer will move farther into the base in the regions laterally removed from the emitter region 11, as shown by the lines 22*a*, the portion directly in front of the emitter region will not move. This will hold the effective part of the base region which is adjacent the emitter region, at the same effective thickness for all voltages which exceed the critical voltage. The portion of the depletion layer which surrounds the embedded layer 20 moves farther into the collector region and also into the embedded layer, as shown. It will be apparent that in order for the front edges of the depletion layer to remain spaced from the emitter region 11, the embedded layer 20 must have a lateral extent somewhat greater than that of the emitter region. The edges 22*a* of the depletion layer extend forward of the base-emitter junction and punch-through to the emitter region would take place except for the locking action. By making the embedded layer 20 somewhat wider than the emitter region 11, clearance between the depletion layer 22 and the emitter region is insured.

Figure 3A:
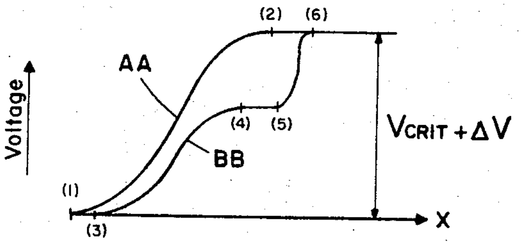
FIGS. 3A and 3B illustrate certain properties of the transistor of FIG. 2.
Figure 3B:
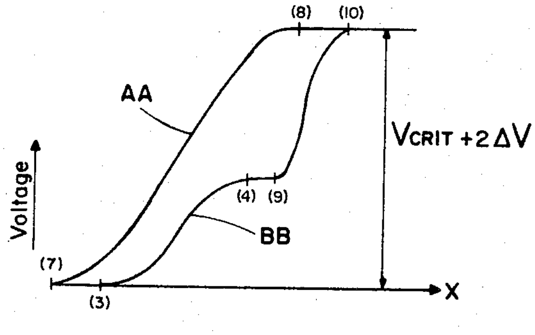

FIGS. 3A and 3B show the voltage distribution through different portions of the transistor of FIG. 2, for different voltages applied to the collector region 12. FIG. 3A shows the voltage distribution for the voltage $V_{crit}+\Delta V$, which is the voltage applied to provide the depletion layer represented by the lines 21 in FIG. 2. FIGS. 3A and 3B are positioned with respect to FIG. 2 to relate the voltage distribution diagrams with the physical configuration.

Curve AA of FIG. 3A shows the voltage distribution along the section of the transistor indicated at AA in FIG. 2. This shows the depletion layer substantially as it would be through the entire transistor in the absence of the embedded layer 20. Curve AA shows that the voltage between the collector and base regions has a double parabolic distribution through the depletion layer, represented by the curve AA between points 1 and 2.

Curve BB in FIG. 3A shows the distribution through the transistor along the line BB of FIG. 2, which extends through the embedded layer 20. Since the depletion layer is held away from the emitter region 11, curve BB starts at a point 3 which is displaced from the point 1. The voltage has a double parabolic distribution between points 3 and 4 which defines the limits of the portion 21*a* of the depletion layer. The voltage will remain substantially constant through the portion of the embedded layer 20 from the boundary 20*a* thereof to the depletion layer formed therein and indicated by the dot-dash line 21 in FIG. 2. This is an inactive region, and is shown in FIG. 3A between points 4 and 5. The voltage distribution through the portion of the depletion layer indicated as 21*b* in FIG. 2, between the points 5 and 6 in FIG. 3A, is again of double parabolic distribution.

FIG. 3B shows the voltage distribution across the transistor of FIG. 2 when the voltage applied to the collector region is further increased. This corresponds to the voltage referred to as $V_{crit}+2\Delta V$, which produces the depletion layer shown by the dash-*x* lines 22 in FIG. 2. The voltage distribution along the line AA (shown by curve AA) is again a double parabolic distribution which extends from point 7 to point 8. This region is thicker than the region between points 1 and 2 in FIG. 3A, since the depletion layer has spread farther into both the base and collector regions.

The voltage distribution through the transistor of FIG. 2 along the line BB through the embedded layer, which is shown in FIG. 3B by curve BB, is the same between the points 3 and 4 as in FIG. 3A, although FIG. 3B represents a greater applied voltage. This is because the depletion layer along this line does not change as the voltage is increased above the critical value. Point 3, as previously stated, is defined by the portion of the depletion layer nearest the emitter electrode, and point 4 is defined by the boundary 20*a* of the embedded layer 20. This, again, is the portion designated 21*a* in FIG. 2. The voltage along line BB will remain substantially constant from point 4 to point 9, which is the inactive portion of the embedded layer 20 and provides a gap between the two portions of the depeletion layer. Point 9 is spaced closer to point 4 than was point 5, since the depletion layer extends farther into the embedded layer 20, from the boundary 20*b* thereof, when the voltage is increased. The portion of the depletion layer extending around the embedded layer 20 into the collector region, and extending from the boundary 20*b* into the layer 20, is thicker than the corresponding layer provided by the lower voltage, as shown by the points 9 and 10. The additional voltage ΔV applied to the collector region all appears across this portion. Accordingly, this voltage interval is twice as large as the interval represented by the correspoding part of curve BB of FIG. 3A.

The fact that the voltage distribution across the depletion layer between the base region and the embedded layer is constant for different voltages is very important in the operation of the transistor. The fact that the voltage distribution in the part of the transistor remote from the base-emitter junction is different is of little significance, since this is out of the active region of the transistor. Accordingly, the gain of the transistor is substantially the same for all voltages applied to the collector region above the critical voltage. This is to be contrasted with prior transistors as described in connection with FIG. 1. Because the depletion layer adjacent the emitter is fixed, the base region can be made thinner so that higher gain is possible.

The transistor in accordance with the invention also provides improved high frequency operation. As the base region is thinner, the transit time for carriers to traverse the base region is less. This substantially increases the upper frequency range of operation. Also, since the depletion layer is divided into two separate depletion layer portions, the effective capacitance is that of two capacitors in series, and the total capacitance is substantially less. Although the thickness of each of the two portions is less than the total thickness of the depletion layer of prior transistors, the capacitance of each portion is such that the total capacitance will be less than in the prior structures.

Figure 4A:
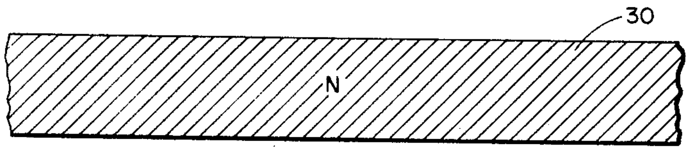
FIGS. 4A to 4E illustrate the steps of constructing the transistor of FIG. 2.
Figure 4B:
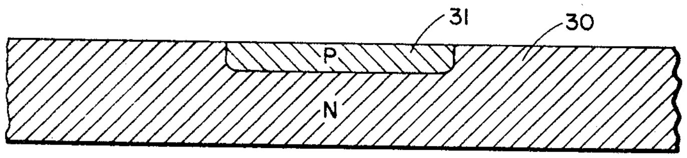

FIGS. 4A to 4E illustrate the construction or fabrication of the transistor in accordance with the invention. FIG. 4A shows the N type substrate 30 which may be used in an NPN transistor as described. This substrate forms part of the collector region. FIG. 4B shows a P type layer 31 embedded in the N type substrate. This can be provided by diffusion, in which case an oxide layer would be provided across the substrate 30 having an opening through which the P region 31 is diffused. Alternately, the P region 31 can be provided by etching out a cavity in substrate 30 and producing the P region by epitaxial regrowth.

Figure 4C:
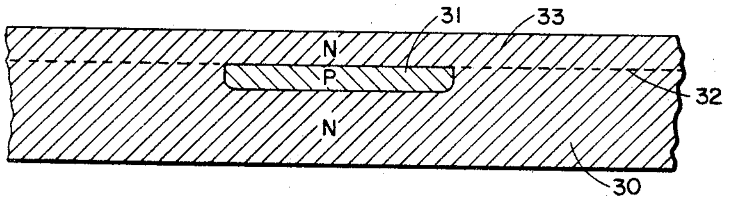

FIG. 4C shows the provision of an N layer 33 on top of the structure of FIG. 4B, and this may be provided by epitaxial growth. Since this region is of the same N type as the region 30, it will join therewith to form a single collector region. The dotted line 32 shows the junction between the original N type substrate 30 and the N layer 33 grown thereon. The two portions 30 and 33 become the collector region, and the dotted line is removed from subsequent figures. The layer 31 then forms a P type portion buried within the collector region.

Figure 4D:
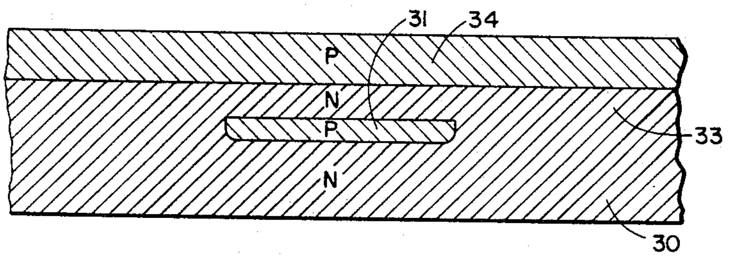
Figure 4E:
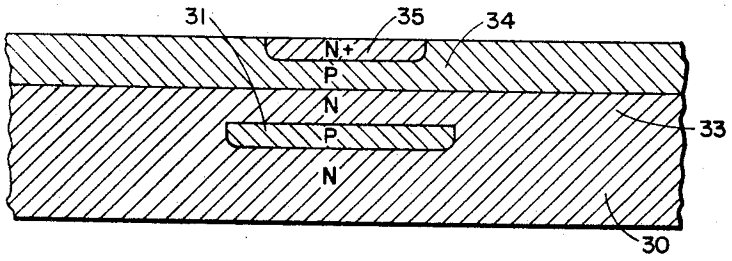

FIG. 4D shows the provision of an additional P layer 34 on the collector region. This may be grown epitaxially across the entire collector structure and forms the base region of the transistor. FIG. 4E shows the final step wherein the N+ type emitter region 35 is provided in the P type base region 34. The emitter region may be provided by diffusion.

Although the dimensions of a transistor constructed in accordance with the invention will vary through wide ranges for different applications, representative values for a transistor as shown in FIG. 4 are as follows:

| | | |
|---|---|---|
| Collector region **33** | mil thick | 0.2 |
| Collector region **33** | do | 0.2 |
| Base region **34** (between collector and emitter regions) | do | 0.2 |
| Emitter region **35** | mil thick | 0.2 |
| | mil wide | 1.0 |
| Embedded layer **31** | mil thick | 0.2 |
| | mils wide | 1.2 |

As previously stated, the invention has been described in connection with an NPN transistor, but a PNP type transistor may be provided with the same configuration. In any case, the embedded layer in the collector region should have low or intermediate resistivity and this can be provided by high or intermediate doping. The emitter will, in most cases, have heavy doping in accordance with normal transistor construction practices. The base electrode may have intermediate doping similar to the layer embedded in the collector electrode. The collector itself should have light doping.

Figure 5:
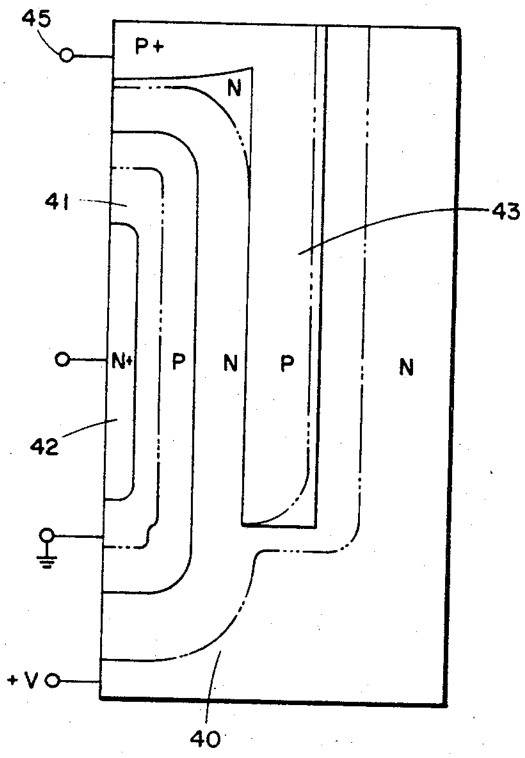
FIG. 5 illustrates a modified transistor construction in accordance with the invention.

In FIG. 5 there is shown a further embodiment of the invention. The transistor of FIG. 5 has an N type collector region 40, a P type base region 41 and an N type emitter region 42. The P type layer 43 embedded in the collector 40 has a portion extending outside the collector for making a connection thereto. All of the regions extend to a single surface to facilitate the connection thereto, although the collector connection can alternatively be made to the opposite surface. When no potential is applied to the terminal 45, the transistor of FIG. 5 operates in exactly the same manner as the transistor illustrated in FIG. 2.

Figure 6:
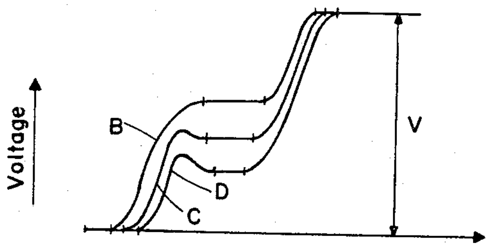
FIG. 6 illustrates certain properties of the transistor of FIG. 5.

FIG. 6 illustrates the voltage distribution across the transistor. The curve B shows the distribution when no potential is applied to terminal 45, and this corresponds generally to the voltage distributions shown by the curves BB in FIGS. 3A and 3B. When a reverse bias is applied to the embedded layer 43, that is a voltage less positive than the voltage at which the embedded layer 43 floats as just referred to, the voltage distribution changes as shown by curves C and D of FIG. 6. Curve C shows the voltage distribution when the voltage at the layer 43 is less by a first amount, and curve D shows the voltage distribution when a still larger reverse bias is applied to terminal 45. It will be apparent that in this case the voltage distribution in the active base region of the transistor differs so that the current transfer characteristic of the transistor is changed. This, therefore, provides a further control of the transistor action.

The transistor as illustrated in FIG. 5 can be used in various different applications. In the event that it is used as an amplifier, the input signal can be applied to the emitter electrode 42 for the grounded base operation shown here, with the load connected to the collector electrode 40. For grounded emitter operation, the input signal can be applied to the base electrode. By applying a bias potential to terminal 45 connected to the embedded layer 43, a further control can be utilized, such as for gain control of the amplifier. It may also be desired to provide varying signals to both the emitter and the embedded layer, as for providing modulating action.

The transistor of FIG. 5 can be operated to provide substantially the same action as a vacuum tube. In such case, the emitter 42 is biased negative with respect to the base electrode 41, and the input signal is applied to the terminal 45 so that the embedded layer 43 acts as a grid. The terminal 45 presents a high impedance in the same manner as the grid of a tube. The load is again connected to the collector region.

When layer 45 is used as a "grid," this transistor is very analogous to a vacuum tube triode. Reverse biasing this "grid" with respect to its surroundings introduces a potential hill in the voltage profile, as is shown in FIG. 6. Electrons in transit to the collector region, which is analogous to the vacuum tube plate, must surmount this hill. (Electrons move up on this diagram.) Thus the base and emitter regions combined are analogous to the vacuum tube cathode which supplies electrons for controlled transfer to the collector or plate.

Transistors constructed in accordance with the invention are highly desirable in applications where high power, high frequency operation is required. One such application is a radio frequency amplifier stage where large voltage swings at high frequency are encountered. Another application is in a line distribution amplifier which applies video signals to a coaxial line. The transistor of the invention provides improved performance because the gain remains constant over a large range of applied voltages. However, by applying a bias potential to the lock layer, a controlled variation in gain can be provided and this can be utilized as in an automatic gain control amplifier. As has been fully set forth, the transistor may also be used as an analog transistor by applying the input voltage to the embedded iayer.

I claim:

1. A semiconductor device including a body of semiconductor material having a base region of one conductivity type, and emitter and collector regions of a conductivity type opposite to said one conductivity type, said emitter and collector regions each forming a junction with said base region, said emitter region having a transverse extent less than that of said base and collector regions, a lock region of said one conductivity type at least partially embedded in said collector region and spaced from the junction between said collector and base regions, said lock region having a greater transverse extent than said emitter region and being completely coextensive with said emitter region but of less transverse extent than said collector region, and circuit means electrically connected to said base and collector regions and providing a direct current bias potential therebetween, so that a depletion layer forms at the junction between said collector and base regions and extends therefrom into both said regions, said lock region being positioned to be engaged by said depletion layer before said layer reaches said emitter region, so that said depletion layer punches through at said lock region and is prevented from extending further toward said emitter region, said circuit means including portions connected to said emitter and lock regions for applying first and second control signals respectively thereto, for controlling the conduction between said base and collector regions.

2. A semiconductor device including a body of semiconductor material having an intermediate region of first conductivity type material with first and second regions of opposite conductivity type and forming respectively first and second rectifying junctions with the intermediate region, the second junction having a smaller lateral extent than the first junction, the improvement including in combination, a depletion-layer shaping-and-locking region having the first conductivity type material and at least partially embedded in said first region extending in spaced parallel relation to said junction forming a first portion in said first region and of lateral extent at least as great as lateral extent of the second junction for limiting penetration of any depletion layer about said first junction toward said second junction by being spaced from said first junction such that the depletion region thereof reaches said locking region before reaching the second junction and said first region including a second portion outside the lateral extent of said locking region wherein depletion is not limited in penetration by said locking region into the first and second regions.

3. A semiconductor device with a semiconductor body having major surfaces with edges forming its periphery having first, second and third regions with first and second junctions therebetween with the second junction being of lesser lateral extent than the first junction and the second region being subject to punch-through and consisting of conductivity type material opposite to the type material in the first and third regions, the improvement including in combination, a lock region of the second region conductivity type material at least partially embedded in said first region having a section extending in spaced parallel relation to the first junction forming a first portion between the first junction and the lock region laterally coextensive with the second junction such that the penetration of a depletion layer about the first junction reaches said lock region before reaching said second junction and is thereby limited in penetration by said lock region, and a second portion in said first region adjacent said lock region laterally outside said first portion wherein penetration of such first junction depletion layer is not limited by said lock region.

4. The improvement in a semiconductor device as set forth in claim 3 wherein said lock region extends to a surface for accommodating an external electrical connection.

5. The improvement in a semiconductor device as set forth in claim 4 wherein said first and second junctions intersect the same surface of the semiconductor body and said lock region has a section extending to said same surface.

6. The improvement in a semiconductor device as set forth in claim 5 wherein said lock region surface extending sections form a portion of one edge of said body adjacent said same surface.

7. The improvement in a semiconductor device as set forth in claim 5 wherein said surface extending section forms an L-shaped region with said spaced section extending along said first junction with the juncture of the two mentioned lock region sections forming an acute angle opening toward said first junction.

8. A semiconductor device including a body of semiconductor material having a base region of one conductivity type, and emitter and collector regions of a conductivity type opposite to said one conductivity type, said emitter and collector regions each forming a junction with said base region, a lock region of said one conductivity type at least partially embedded in said collector region and spaced from the junction between said collector and base regions and being of greater lateral extent than and disposed opposite and in parallel relation to said emitter region and being of lesser lateral extent than said collector region, so that any depletion layer forming at the junction between said collector and base regions and extending therefrom into both such regions reaches said lock region before said emitter region and is limited in depth of penetration into said base and collector regions inhibiting said layer from reaching said emitter region and an electrical connection to said collector region spaced from said lock region opposite said junctions, so that said depletion layer punches through at said lock region and is prevented from extending further toward said emitter region.

9. A semiconductor device having a body of semiconductive material with a base region of one conductivity type material and emitter and collector regions of material of opposite conductivity type to said one type, and the collector region having a major surface, said emitter and collector regions being separated by said base region and forming emitter-base and collector base junctions with said base region respectively, each having laterally extending portions, said body having a laterally extending lock region of said one conductivity type material and being at least partially embedded within said collector region, said lock region being spaced from the collector-base junction and in parallel relation with at least a laterally extending portion thereof, and being of greater lateral extent than the emitter region and of lesser lateral extent than said base region and juxtaposed therewith such that any depletion layer about said collector-base junction within the lateral extent of such lock region is limited in said base region to that penetration corresponding to a critical voltage causing such depletion layer to reach said lock region before reaching the emitter-base junction and such depletion layer not being limited by said lock region in penetration of said base region outside said lock region lateral extent.

10. The invention of claim 9 wherein said lock region has a greater lateral extent than said emitter region and is positioned in said collector region intermediate and spaced from said major surface and said collector-base junction.

11. A semiconductor device including a body of semiconductive material with a first region, second and third regions separated by said first region and each forming a junction with said first region, said first region being of one conductivity type material and portions of said second and third regions respectively forming junctions with said first region being of an opposite conductivity type material to said one type, said third region having a buried lock region spaced from the junction between said first and third regions consisting of said one conductivity type material and at least partially embedded in said third region portion and being laterally coextensive with said second region and of lesser lateral extent than said third region portion, circuit means electrically connected to said first and third regions and supplying a direct current potential therebetween such that a depletion layer is formed at the junction between said first and third regions and which extends from the junction into said first and third regions, said lock region being positioned to limit penetration of said depletion layer into said first and third regions by intercepting said depletion region before said depletion reaches the junction between said first and second regions while laterally outside said lock region such depletion layer penetration is not so limited.

12. The device of claim 11 wherein said second region is of lesser lateral extent than either said first or third regions and said junctions have parallel central portions with said lock region laterally extending in parallel relationship to such central portions and being completely embedded within said third region.

13. A semiconductor device including a body of semiconductive material with a base region of one conductivity type, emitter and collector regions of a conductivity type material opposite to said one type, said emitter and collector regions each forming a junction with said base region each of which have a central laterally extending portion in parallel spaced-apart relation, said emitter region having a lateral extent less than that of said base and collector regions, a lock region of said one conductivity type at least partially embedded in said collector region and spaced from the junction central portion between said collector and base regions in parallel relation, said lock region having a greater lateral extent than said emitter region and being completely coextensive therewith and having a lesser lateral extent than said collector region, such that any depletion layer forming at the junction between said collector and base regions and extending therefrom into both regions is engaged by said lock region before said layer reaches said emitter region, such that said deplection layer first punches through at said lock region and is thereby prevented from extending further towards said emitter region in said base region adjacent said lock region and said depletion layer not being limited in penetration laterally outside said lock region.

14. A semiconductor device including a body of semiconductive material with a base region of one conductivity type, emitter and collector regions of opposite conductivity type to said one type with major surfaces on such regions, said emitter and collector regions being separated by said base region and each forming a junction with said base region, said body having a lock region of said first conductivity type at least partially embedded in said collector region with a lateral section spaced from said junctions and said surfaces in parallel relation, said lock region having a portion extending to one of said major surfaces, said lock region section being of greater lateral extent than said emitter region and of lesser lateral extent than said base region and juxtaposed therewith such that any depletion layer about said collector-base junction first reaches said lock region before said emitter region such that penetration of the depletion layer into said base region corresponds to a critical voltage causing the depletion layer to first reach said lock region and said depletion layer not being limited in penetration of said base or collector regions laterally outside said lock region.

15. A semiconductor device having a body of semiconductive material with a pair of major surfaces and a base region of one conductivity type material, emitter and collector regions of a conductivity type material opposite to said one type, said emitter and collector regions each forming a junction with said base region with said junction each having central portions parallel with one another, said emitter region having a lateral extent less than that of said base and collector regions, the lock region of said one conductivity type at least partially embedded in said collector region and spaced in parallel relation from a central portion of said junctions and spaced inwardly from said major surfaces, said lock region having a greater lateral extent than said emitter region and being completely coextensive therewith but of lesser lateral extent than said body, and circuit means including electrodes electrically connected to said base, emitter collector and lock regions and providing a direct current bias potential at said collector region, so that a depletion layer forms at the junction between said collector and base regions and extends therefrom into both of said regions, said lock region being spaced from said collector electrode and positioned to be engaged by said deplection layer before such layer reaches said emitter region so that said depletion layer punches through at said lock region and is thereby prevented from extending further toward said emitter region, said circuit means supplying a first control signal to one of said base and emitter regions and a second control signal to said lock region to control conduction to said collector region.

(References on following page)

References Cited

UNITED STATES PATENTS

| | | | |
|---|---|---|---|
| 2,779,877 | 1/1957 | Lehovec | 250—211 |
| 2,874,232 | 2/1959 | Jochems | 179—171 |
| 2,939,056 | 5/1960 | Muller | 317—235 |
| 3,193,740 | 7/1965 | Osafune et al. | 317—235 |
| 3,239,728 | 3/1966 | Aldrich et al. | 317—235 |
| 3,253,197 | 5/1966 | Haas | 317—235 |
| 3,283,223 | 11/1966 | DeWitt et al. | 317—235 |

JOHN W. HUCKERT, *Primary Examiner.*

R. F. SANDLER, *Assistant Examiner.*